US007502076B2

(12) United States Patent
Xiu et al.

(10) Patent No.: US 7,502,076 B2
(45) Date of Patent: Mar. 10, 2009

(54) METHOD AND APPARATUS FOR A DIGITAL DISPLAY

(75) Inventors: Liming Xiu, Plano, TX (US); Wen Li, Plano, TX (US); Xiaopeng Li, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 775 days.

(21) Appl. No.: 11/187,313

(22) Filed: Jul. 21, 2005

(65) Prior Publication Data

US 2006/0256119 A1 Nov. 16, 2006

Related U.S. Application Data

(60) Provisional application No. 60/676,144, filed on Apr. 28, 2005.

(51) Int. Cl.
*H03M 1/12* (2006.01)
*H03L 7/00* (2006.01)

(52) U.S. Cl. ....................... 348/572; 348/537; 348/536; 348/524; 345/520; 345/213

(58) Field of Classification Search ................ 348/537, 348/572, 573, 536, 539, 524, 543, 544, 739; 375/355, 362, 373–376; 345/520, 204, 213; 341/155

See application file for complete search history.

(56) References Cited

U.S. PATENT DOCUMENTS 5,847,701 A 12/1998 Eglit
6,097,444 A 8/2000 Nakano
6,268,848 B1 7/2001 Eglit
6,483,447 B1 11/2002 Eglit
6,492,983 B2 * 12/2002 Nishitani et al. ............ 345/213
6,556,191 B1 * 4/2003 Ouchi ........................ 345/204
6,704,009 B2 * 3/2004 Tachibana et al. ........... 345/213
7,002,634 B2 * 2/2006 Tai et al. ..................... 348/537
7,133,480 B2 * 11/2006 Colborne et al. ............ 375/355

(Continued)

OTHER PUBLICATIONS

"100 MSPS/140 MSPS Analog Flat Panel Interface," AD9884A Data Sheet, Rev. C, Analog Devices, Inc., 2001, pp. 1-24.

(Continued)

*Primary Examiner*—David L Ometz
*Assistant Examiner*—Jean W Désir
(74) *Attorney, Agent, or Firm*—Warren J. Franz; Frederick J. Telecky, Jr.; Wade J. Brady, III

(57) ABSTRACT

A method and apparatus for a digital video display. A digital display device receives an analog signal representing an image formed of pixels in video lines and a signal containing a synchronization waveform for the image. An analog-to-digital converter (ADC) receives the analog signal and converts it to a sampled digital waveform. A phase-locked loop including a programmable frequency divider controls the sampling time for the ADC. The programmable frequency divider is controlled by a dividing-ratio algorithm that selects a dividing ratio, measures the number of pixels in a video line using the dividing ratio, and recomputes the dividing ratio by multiplying the selected dividing ratio by the expected number of pixels in a video line and dividing by the measured number of pixels. The sampling phase for the ADC is selected by a sampling-phase control algorithm that minimizes a function representative of the flatness of the sampled digital waveform.

20 Claims, 8 Drawing Sheets

U.S. PATENT DOCUMENTS

| | | | | |
|---|---|---|---|---|
| 7,154,495 | B1 * | 12/2006 | Bucklen | 345/213 |
| 7,391,416 | B2 * | 6/2008 | Yearim | 345/213 |
| 7,409,030 | B2 * | 8/2008 | Cheng | 375/376 |
| 7,425,994 | B2 * | 9/2008 | Haider et al. | 348/572 |
| 2005/0162552 | A1 * | 7/2005 | Xiu et al. | 348/521 |
| 2007/0041472 | A1 * | 2/2007 | Norman et al. | 375/316 |

OTHER PUBLICATIONS

Omori, S., et al., "High-Resolution Image Using Several Sampling-Phase Shifted Images," IEEE, 2000, pp. 178-179.

Shinagawa, M., et al., "Jitter Analysis of High-Speed Sampling Systems," IEEE Journal of Solid-State Circuits, vol. 25, No. 1, Feb. 1990, pp. 220-224.

Makhija, M.G., et al., "Simulating Clock Jitter in Digital Communication Systems," IEEE, 1996, pp. 716-720.

"THS8083, Triple 8-Bit, 80 MSPS, 3.3-V Video and Graphics Digitizer With Digital PLL," Data Manual, Texas Instruments Inc., Apr. 2001, 61 pgs.

"VESA and Industry Standards and Guidelines for Computer Display Monitor Timing," Video Electronics Standards Association, Version 1.0, Revision 0.8, Sep. 17, 1998, pp. 1-37.

"Generalized Timing Formula Standard," Video Electronics Standards Association, Version 1.1, Sep. 2, 1999, pp. 1-31.

Mair, H., et al., "An Architecture of High-Performance Frequency and Phase Synthesis," IEEE Journal of Solid-State Circuits, vol. 35, No. 6, 2000, pp. 835-846.

* cited by examiner

*FIG. 1*
*(PRIOR ART)*
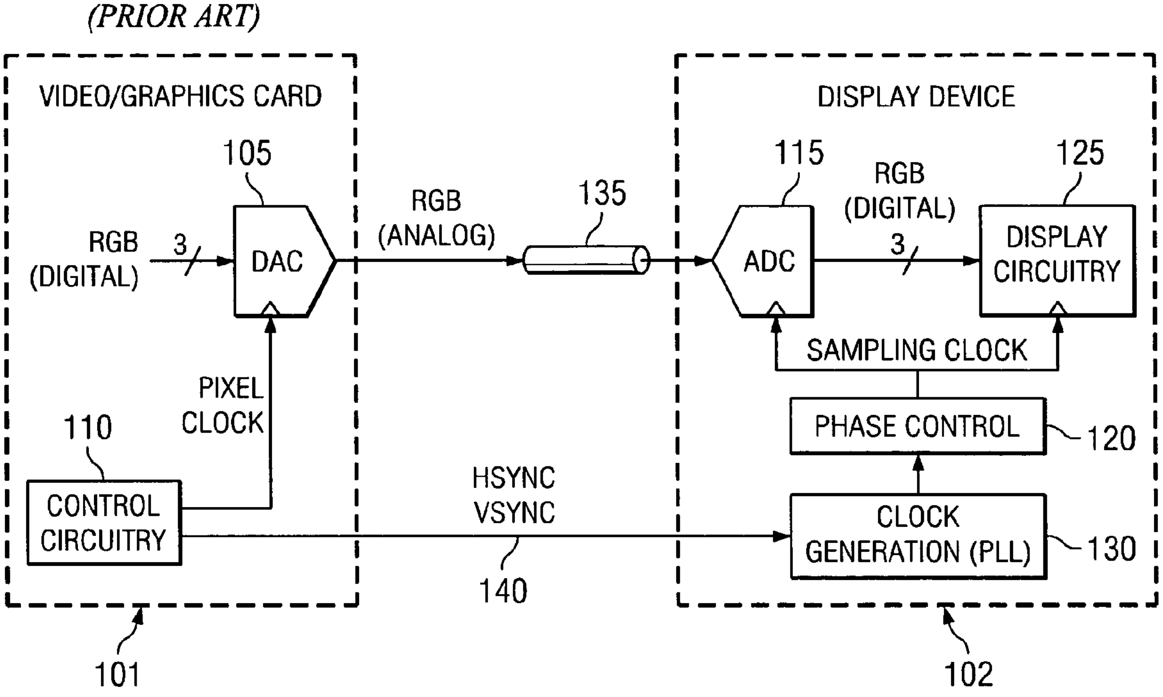
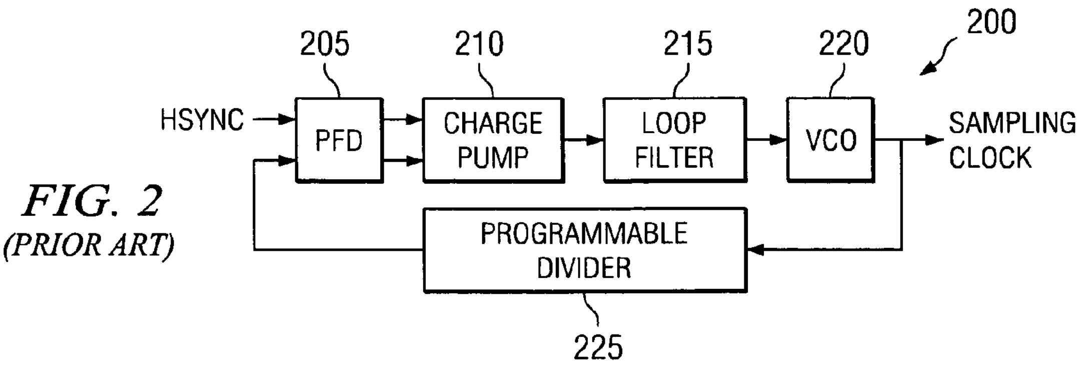
*FIG. 2*
*(PRIOR ART)*

METHOD AND APPARATUS FOR A DIGITAL DISPLAY

This application claims priority of U.S. Provisional Application Ser. No. 60/676,144 filed Apr. 28, 2005, entitled "Method and Apparatus for Automatically Searching the Sampling Frequency and Optimum Sampling Phase for Graphic Digitizer in Pixelated Display Applications," which application is incorporated herein by reference.

TECHNICAL FIELD

This invention relates generally to digital display devices, and in particular, to a method and implementation for selecting the sampling frequency and phase of an analog video signal prior to conversion to a digital format.

BACKGROUND

When analog video signals such as RGB (red-green-blue) or YUV (luminance-chrominance) video signals of a video/graphics image are displayed on a pixelated display device, graphics digitizers employing analog-to-digital conversion are utilized to convert the analog signals to a digital format. The conversion from an analog to a digital format generally utilizes three analog-to-digital converters (ADCs), which convert, for example, red, green, and blue analog signals to digital signals simultaneously. In analog-to-digital conversion, identifying the correct sampling frequency for the ADCs is essential since even a small error in sampling frequency can impair the resulting displayed images. The phase of the sampling clock for analog-to-digital conversion is also critical since improper selection of phase can also create undesirable visible effects. Thus, when a pixelated display device is driven with analog signals, a circuit is required to automatically search for the correct sampling frequency to produce a high quality image. This is necessary because analog signals are generally produced from signals derived from a clock with frequency and phase that is not perfectly synchronized with the frequency and phase of a local clock controlling the analog-to-digital converters. In addition, a second circuit is generally required to automatically search for the appropriate sampling phase. The sampling phase is the point in time within a sampling clock's cycle for triggering the ADC.

An example of a graphical display device developed for personal computers and television receivers that can utilize a digital video signal is a liquid crystal display (LCD). LCDs offer space savings, lower radiation emission, and lower power consumption compared to cathode-ray tube (CRT) monitors which directly use analog video inputs. Since an analog display interface is still the dominant interface between an image source and a display device, particularly in the personal-computer industry, the use of graphics digitizers to convert analog signals to digital signals has become a vital process for interfacing image sources to digital display devices such as LCDs. Several commercial devices formed as integrated circuits are available to provide analog-to-digital video conversion, such as the Texas Instruments, Inc. THS8083, as described in the THS8083 Data Manual, Texas Instruments Inc, dated April 2001, and the Analog Devices, Inc. AD9884A as described in the AD9884A Data Sheet, Rev. C, Analog Devices, Inc., dated 2001, pp. 1-24. These devices each contain three ADCs that simultaneously convert red, green, and blue analog video signals to corresponding video signals in a digital format.

FIG. 1 illustrates an exemplary block diagram showing the interconnection of signals in a pixelated display system, i.e., a "digitally driven display system" or a "digital display system." Pixelated display systems are distinguished from analog display systems such as CRTs by displaying images with fixed pixel locations that are formed in the manufacturing process. CRTs can display an image over a continuous surface such as the surface of a CRT, and accordingly are driven directly with analog signals.

In the block diagram illustrated in FIG. 1, video or graphic images are generated inside a video/graphics card 101 such as a video/graphics card in a personal computer. Digital images are converted in this card to analog waveforms by digital-to-analog converters (DACs) such as DAC 105. Digital signals such as RGB signals in a digital format are supplied to the DAC from an external source (not shown). The analog waveforms produced by the digital-to-analog conversion are coupled over line 135 to digital display device 102 such as an LCD display device and converted to a digital format by ADC 115. Control circuitry 110 controls the DAC and produces horizontal and vertical synchronization signals HSYNC and VSYNC that are coupled to the display device over line 140. In the display device, a clock generation circuit 130, usually implemented with a phase-locked loop (PLL), generates a sampling clock signal though a phase control circuit 120 to control the sampling instant of the ADC and display circuitry 125. In such display applications, a key issue for high quality image recovery is thus accurate determination of both the sampling frequency and the sampling phase for the ADCs. These two factors have a dominant impact on the quality of displayed images.

A phase-locked loop 200 such as illustrated in FIG. 2 is commonly used to generate the sampling frequency for the ADCs. When a PLL is locked onto the horizontal synchronization signal (HSYNC), its output is used as the sampling clock for the ADCs. The dividing ratio of the programmable frequency divider 225 is typically programmed to the "number of total pixels per video line" for a given video/graphics mode. Thus, the resulting frequency of the sampling clock is the HSYNC frequency multiplied by the "number of total pixels per video line." Ideally, by this mechanism, the sampling clock will have the same frequency as that of the pixel clock in the video card. However, this does not occur in practice because the low frequency HSYNC signal is usually noisy and has significant timing jitter. Furthermore, its frequency may not be accurate. In addition, the pixel clock frequency of the video/graphics card might not be equal to the frequency as specified in the Video Electronics Standards Association (VESA) specification, "Generalized Timing Formula Standard," Version 1.1, Sep. 2, 1999, pp. 1-31. As a result, the original image that is encoded in the analog signals may not be accurately recovered. Thus, a process to determining the sampling frequency is essential in real applications to display high quality images.

In the block diagram illustrated in FIG. 2, PFD 205 is a frequency and phase detector that converts the frequency or phase difference of its two inputs to voltage signals. The voltage-controlled oscillator (VCO) 220 is an oscillator with frequency dependent on an input control voltage. The programmable frequency divider 225 in the feedback loop divides the VCO frequency to a proportionately lower value. The charge pump 210 and the loop filter 215 convert and filter the PFD output to a signal level with noise sufficiently attenuated that it can be utilized as input by the VCO. The output of the VCO (which is the sampling clock of the ADC) is locked to the HSYNC signal through the programmable frequency divider. The dividing ratio of the programmable frequency divider determines the VCO frequency. Ideally, this ratio should be the "number of total pixels per video line" as suggested in the VESA specification. However, the number represented by the "number of total pixels per video line" is not always honored by all the video card vendors and the resulting frequency will not be correct in those cases, again demonstrating that an improved frequency detection process is required to find the correct dividing ratio so that a high quality image can be displayed.

A further uncertainty in producing a high quality image on a digital display device is the typical use of separate electrical paths to couple analog display signals and other timing reference signals from a graphics source to the digital display device. Due to varying cable lengths and impedances, timing reference signals and the analog display signals can be received by the display device at slightly varied times. Thus, deciding when to sample the analog display signals (by adjusting the clock edge within a sampling clock cycle) has substantial impact on the quality of displayed images. The exact point in time of sampling within a cycle of the sampling clock is defined as the sampling phase. The task of determining the appropriate sampling phase could be done manually by a user through visual inspection of displayed images. However, different users may apply different judgments when choosing "good" images. Manual techniques are often cumbersome, even for experienced users, and are thus often impractical and produce variable results.

Eglit, in U.S. Pat. No. 5,847,701 entitled "Method and Apparatus Implemented in a Computer System for Determining the Frequency Used by a Graphics Source for Generating an Analog Display Signal," dated Dec. 8, 1998, describes searching sampling frequencies using predetermined test patterns. Sequences of test patterns are encoded in an analog video source and transmitted to a digital display device where the analog signal is converted to sequences of sampled values. The digital display device determines whether the sampled values equal one of the sequences of the test patterns based on a predetermined convention. The digital display device changes the sampling frequency until the sampled values equal one of the test pattern sequences, and the corresponding frequency is used as the ADC sampling frequency when a match is found. Thus, Eglit in U.S. Pat. No. 5,847,701 requires predetermined test patterns encoded in an analog video source, which in turn requires additional hardware and software. Unfortunately, display device designers usually do not have control over how the video source is configured and how it is designed. Moreover, the operation uses a feedback system which does not specify how the next sampling frequency should be determined. The scheme just varies the sampling frequency, which poses a convergence timing problem. Thus, using the method described by Eglit, a mechanism is still required to efficiently determine the next sampling frequency and impractical constraints placed thereby on the display device designer are not resolved.

Nakano, in U.S. Pat. No. 6,097,444 entitled "Automatic Image Quality Adjustment Device Adjusting Phase of Sampling Clock for Analog Video Signal to Digital Video Signal Conversion," dated Aug. 1, 2000, describes choosing the sampling frequency by detecting the HSYNC and VSYNC frequencies and comparing them to the commonly used standard video timing data specified in the VESA guideline referenced above. The VESA mode whose timing data most closely resembles the detected HSYNC and VSYNC frequencies is the desired VESA mode. The corresponding pixel frequency is used as the sampling frequency. However, a problem with this scheme is that the pixel frequency specified in VESA documents is just a guideline. In real applications, significant frequency deviations occur and a degree of frequency error in the pixel clock is unavoidable, the latter of which adversely affects image quality.

Nakano, in U.S. Pat. No. 6,097,444, further discusses a parameter "Value Difference," which is defined therein as the function $$VF[\text{pixel}]=|vc-vp|$$

where vc, vp are the RGB values of the current and previous pixel, respectively. The phase-searching method described by Nakano finds the pixel "max pixel" in a frame for which VF[max_pixel] is the maximum. Then the sampling phase is varied for a frame and each phase generates a corresponding VF[max_pixel][phase]. Thus, VF[max_pixel][phase] depends on pixel location and frame sampling phase. The phase that makes VF[max_pixel] [phase] achieve the maximum is the optimal frame sampling phase. The process described by Nakano is based on the assumption that if two adjacent pixels have different RGB values, then among all available phases the optimal frame sampling phase should make their RGB Value-Difference the maximum. However, in this process, only two pixels are used for the calculation, which introduces substantial likelihood of random errors. Moreover, there are usually signal overshoot and undershoot responses if two adjacent pixels have significantly different RGB values, which adds further uncertainty and inaccuracy to the process of maximizing VF[max_pixel] [phase]. Thus, the process described by Nakano may not reliably and consistently produce a high quality image. The process also does not utilize relationship information among different pixel phases.

Eglit, in U.S. Pat. No. 6,268,848 entitled "Method and Apparatus Implemented in an Automatic Sampling Phase Control System for Digital Monitors," dated Jul. 31, 2001, discusses values of "peak" and "valley" as illustrated in FIG. 3. In this figure, the x-axis represents a sequence of pixels or, equivalently, the progression of time. The y-axis represents the RGB value of a pixel. The peaks and valleys are found by using pixels in a plurality of video lines for a certain sampling phase. Then a statistical value is generated by summing the magnitudes of the peaks and valleys. The phase that maximizes this value is the optimum sampling phase. Compared to the method presented in U.S. Pat. No. 6,097,444, this method may produce a better image because more pixels are used to make the phase selection decision. But this method does not utilize inter-phase relationship information for the calculation. To be precise, FIG. 3 illustrates a waveform of a series of pixels, where at each pixel position there is only one value, which corresponds to one sampling phase, thereby ignoring the inter-phase relationship among all sampling phases before making a phase selection decision, which may often be less than optimal.

Eglit, in U.S. Pat. No. 6,483,447, entitled "Digital Display Unit Which Adjusts the Sampling Phase Dynamically for Accurate Recovery of Pixel Data Encoded in an Analog Display Signal," dated Nov. 19, 2002, presents a method of searching for the optimal sampling phase by detecting pixels boundaries, or transition points in an analog waveform. Usually the sharp signal transition points, which are required by this method, are accompanied by significant signal overshoot and undershoot and oscillatory ringing. These factors can have an adverse effect on the detection process. Compared to the methods in U.S. Pat. Nos. 6,097,444 and 6,268,848, this scheme does utilize inter-phase relationship information.

However, it requires dedicated hardware (such as ADCs) for each sampling phase, which can be expensive for many sampling phases.

The main limitations of the prior art circuits are thus imprecise, unreliable, or impractical determination of the sampling frequency and selection of the optimal sampling phase for reconstruction of an image for a digital display device. The prior art approaches use processes that employ test patterns, relies on imprecise clocks for digital to-analog conversion, compute with noisy data, ignore inter-phase relationships, and depend on signals with substantial overshoot and undershoot. A need thus exists for an apparatus and method to accurately determine the sampling frequency and to select the optimal sampling phase so that a digital image can be displayed that is not degraded by these limitations.

SUMMARY OF THE INVENTION

Embodiments of the present invention achieve technical advantages as a digital display device that receives an analog signal representing an image formed of pixels in video lines. The video lines include an active video region, and the analog signal contains a synchronization waveform for the image that may be a separate signal or a synchronization waveform superimposed on a video waveform. In a preferred embodiment, an analog-to-digital converter in the digital display device receives the analog signal and converts it into a sampled, digital waveform to display the image. In a further preferred embodiment, the digital display device includes a phase-locked loop that in turn includes a programmable frequency divider controlled by a dividing ratio signal. The phase-locked loop is preferably coupled to the signal containing the synchronization waveform and is coupled to the analog-to-digital converter to control its sampling time. In a preferred embodiment, the dividing-ratio circuit computes the dividing-ratio by selecting an initial dividing ratio, measuring the number of pixels in a video line using the dividing ratio to control the programmable frequency divider, and recomputing the dividing ratio by multiplying the dividing ratio by the expected number of pixels in a video line and dividing by the measured the number of pixels in a video line. In a further preferred embodiment, the digital display device further includes a sampling phase control circuit. The sampling phase control circuit selects the sampling phase by selecting a video line and sampling the video line with a plurality of sampling phases. In a preferred embodiment, the sampling phase is selected by minimizing a function evaluated over a two-dimensional array of pixels and sampling phases, wherein the function is representative of the flatness of the sampled digital waveform. In a further preferred embodiment, the function is representative of change in the sampled digital waveform between sampling phases. In a further preferred embodiment, the sampled digital waveform is filtered with a moving average filter.

In accordance with another preferred embodiment of the present invention, a digital display device receives an analog signal representing an image formed of pixels in video lines. The video lines include an active video region, and the analog signal contains a synchronization waveform for the image that may be a separate signal or a synchronization waveform superimposed on a video waveform. In a preferred embodiment, an analog-to-digital converter in the digital display device receives the analog signal and converts it into a sampled, digital waveform to display the image. In a further preferred embodiment, the digital display device includes a sampling phase control circuit. The sampling phase control circuit selects the sampling phase by selecting a video line and sampling the video line with a plurality of sampling phases. In a preferred embodiment, the sampling phase is selected by minimizing a function evaluated over a two-dimensional array of pixels and sampling phases, wherein the function is representative of the flatness of the sampled digital waveform. In a further preferred embodiment, the function is representative of change in the sampled digital waveform between sampling phases. In a preferred embodiment, the sampled digital waveform is filtered with a moving average filter.

Another embodiment of the present invention is a method of configuring a digital display device to display an image formed of pixels in video lines from an analog signal representing the image. The video lines include an active video region, and the analog signal contains a synchronization waveform for the image that may be a separate signal or a synchronization waveform superimposed on a video waveform. In a preferred embodiment, the method includes receiving the analog video signal in the digital display device and converting the analog video signal into a sampled, digital waveform with an analog-to-digital converter to display the image. In a further preferred embodiment, the method further includes incorporating a phase-locked loop in the digital display device that in turn includes a programmable frequency divider and controlling the programmable frequency divider using a dividing ratio signal. The method includes coupling the phase-locked loop to the signal containing the synchronization waveform and using the phase-locked loop to control the sampling time of the analog-to-digital converter. In a preferred embodiment, the method includes computing the dividing-ratio by selecting an initial dividing ratio, measuring the number of pixels in a video line using the dividing ratio to control the programmable frequency divider, and recomputing the dividing ratio by multiplying the dividing ratio by the expected number of pixels in a video line and dividing by the measured the number of pixels in a video line. In a further preferred embodiment, the method includes providing a sampling phase control circuit in the digital display device to control the sampling phase of the analog-to-digital converter. In a preferred embodiment, the method includes selecting the sampling phase by selecting a video line and sampling the video line with a plurality of sampling phases. In a preferred embodiment, the method includes selecting the sampling phase by minimizing a function evaluated over a two-dimensional array of pixels and sampling phases, wherein the function is representative of the flatness of the sampled digital waveform. In a further preferred embodiment, the method includes using a function that is representative of change in the sampled digital waveform between sampling phases. In a further preferred embodiment, the method further includes filtering the sampled digital waveform with a moving average filter.

The invention solves the problem of displaying an image represented by an analog signal on a digital display device by providing a synchronization signal for an analog-to-digital converter using a programmable frequency divider in a phase-locked loop and counting the resulting pixels in an active region of a video signal. The required sampling phase for the analog-to-digital converter is selected by minimizing a function representative of the flatness of the sampled waveform.

Embodiments of the present invention advantageously provide a digital video display device and methods that can reproduce images from analog signals with high quality and without the need for manual adjustment.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates an exemplary block diagram of the prior art showing the interconnection of signals in a pixelated display system;

FIG. 2 illustrates a phase-locked loop of the prior art;

DETAILED DESCRIPTION OF ILLUSTRATIVE EMBODIMENTS

The making and using of presently preferred embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

Embodiments of the invention will be described with respect to preferred embodiments in a specific context, namely an apparatus and method for selecting the sampling frequency and phase of an analog video signal prior to conversion to a digital format. The embodiments comprise a process to determine the sampling frequency for an analog-to-digital converter by controlling the dividing ratio of a programmable frequency divider so that the correct number of pixels is produced in the active region of a video line. Alternative embodiments further comprise a process to optimally select a sampling phase for the analog-to-digital converter by minimizing a phase-dependent function indicative of the quality of the image to be reconstructed.

In the VESA Generalized Timing Formula Standard ("GTF standard") referenced hereinabove, an objective is to allow predictable timing parameters to be derived from minimal signaling information. Using this standard, it is possible to construct a complete set of timing parameters given certain basic information. One of the critical elements in this standard is the image pixel format. For example, an image format of "800×600" symbolizes an image that has 800 active pixels in the horizontal direction and 600 active pixels in the vertical direction.

Figure 3:
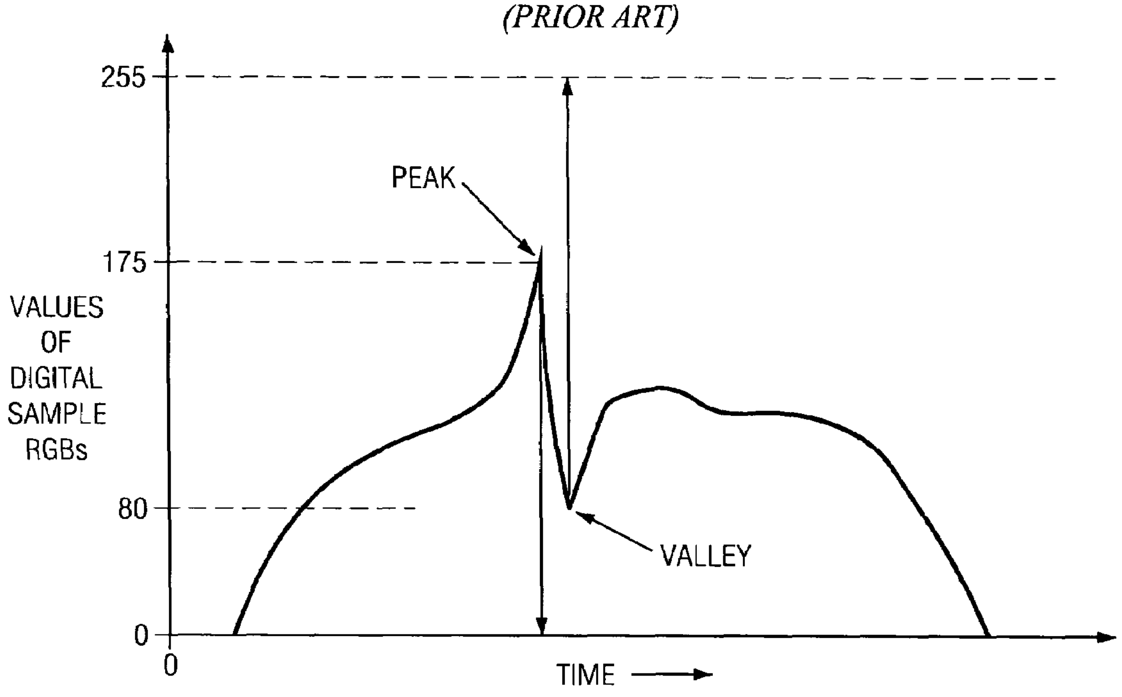
FIG. 3 (PRIOR ART)
FIG. 3 illustrates RGB values of "peak" and "valley" of the prior art.
Figure 4:
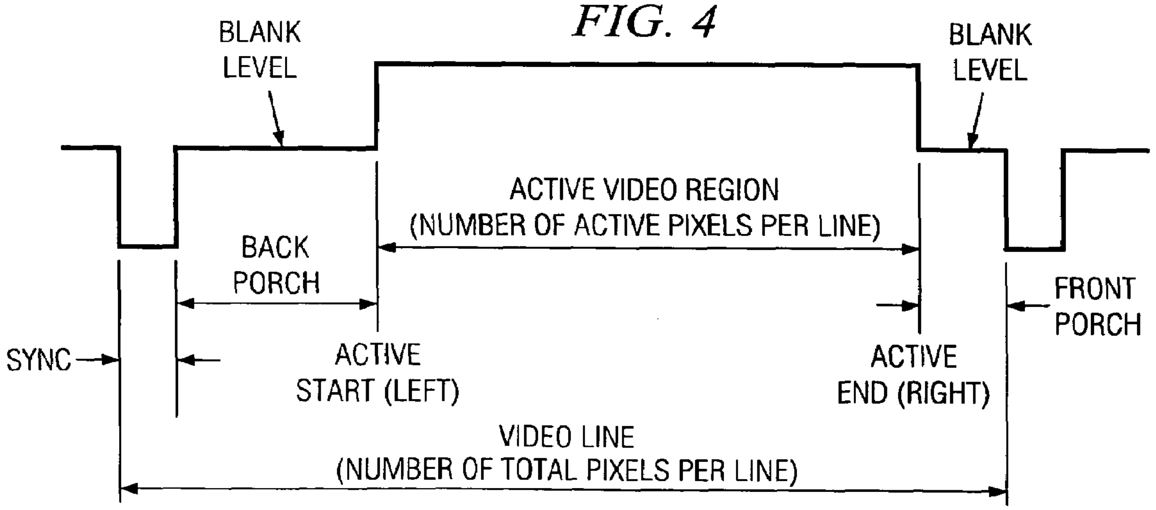
FIG. 4 illustrates a typical waveform of a video signal in the GTF standard.

FIG. 4 illustrates a typical waveform of a video signal in the GTF standard. Pixels in the active video region depict the information that can be seen by viewers. Thus, any error in the "number of active pixels per video line" will be apparent to a viewer. This number is determined by the definition of the given image format. Thus, the correct sampling clock frequency in the display device produces the correct "number of active pixels per video line" in the active video region. The correct sampling clock frequency should precisely equal the pixel clock frequency of the video/graphics card. Since the pixel clock frequency is not transmitted from the video card to the display device as illustrated in FIG. 1, the pixel clock frequency is determined in the invention by adjust the dividing ratio of the PLL divider to make the pixel number in the active video region equal to the "number of active pixels per video line" defined in the VESA specification for the active display mode of the display device. For example, for an 800×600 display format, precisely 800 pixels are correctly displayed in a horizontal line. The signal containing the synchronization waveform may be superimposed onto the analog signal representing the image as illustrated in FIG. 4.

An initial starting frequency is needed for this searching process. It could be produced by the PLL by setting the dividing ratio to the number of total pixels per video line suggested in the VESA specification for a given VESA mode. In the THS8083 device there is an on-chip frequency synthesizer, as described by H. Mair and L. Xiu in the paper entitled "An Architecture of High Performance Frequency and Phase Synthesis," IEEE Journal of Solid-State Circuits, Vol. 35, No. 6, June 2000, pp. 835-846, that can generate any frequency in a certain range. The method of detecting the active VESA mode described by Mair and Xiu is to use a known frequency to measure the HSYNC and VSYNC frequencies and to compare them to the numbers defined in the VESA specification.

The frequency-searching algorithm can be outlined in the following steps with the four definitions below:

DR: dividing ratio of the programmable divider

HTOT: number of total pixels per video line suggested in the VESA specification

HADR: number of active pixels per video line defined in the VESA specification

HADRM: measured number of active pixels in a video line.

Figure 5:
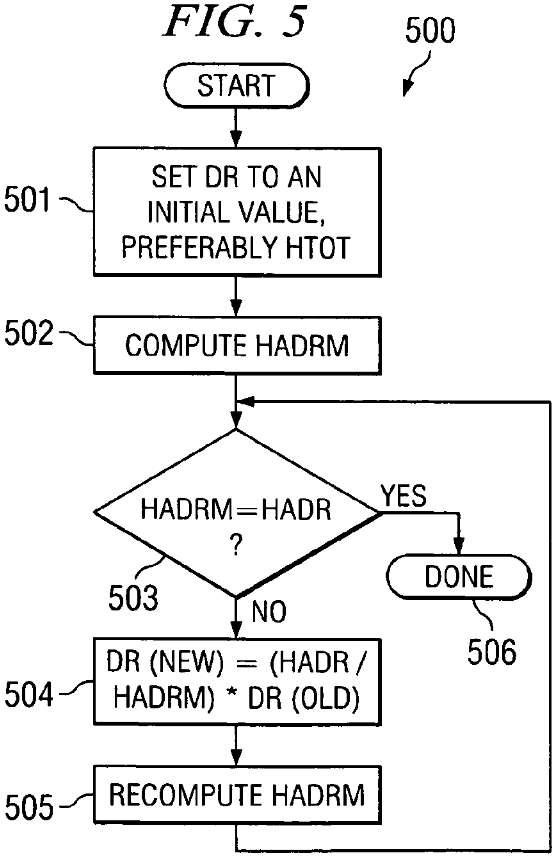
FIG. 5 illustrates a flowchart of the frequency-searching algorithm of the invention.

As illustrated in the flowchart in FIG. 5, the frequency-searching algorithm 500 of the invention can be described as follows. The steps below to control the dividing ratio are keyed to the reference numbers in FIG. 5:

501: Set DR to an initial value, preferably HTOT

502: Compute HADRM

503: If HADRM is not equal to HADR then

504: Reset DR using:

$$DR(\text{new})=(HADR/HADRM)*DR(\text{old})$$

505: Recompute HADRM

If HADRM is not equal to HADR

Then repeat from step 504.

506: Else done (when HADRM is equal to HADR)

The steps above are preferably executed for all three primary colors such as the three video signals in an RGB format or for equivalent or related signals in a color format such as YUV. The largest HADRM for the red, green, and blue signals is the final HADRM. This procedure can be demonstrated by a display example using an XGA screen format (1024 pixels horizontally×768 horizontal lines) at a 60 Hz refresh rate, thus requiring HADR=1024) as described in the "VESA and Industry Standards and Guidelines for Computer Display Monitor Timing," Version 1.0, Revision 0.8, VESA, Sep. 17, 1998, pp. 1-37.

If the dividing ratio DR is initially and arbitrarily set to 1296, the initially computed HADRM for this case is 987, which is not correct for this image format. The corrected dividing ratio can then be calculated as (1024/987)·1296=1344. The corrected number (1344) is stored in the PLL's programmable divider, and the resulting sampling frequency correctly produces 1024 pixels in the active video region.

Since the searching process must be able to sample multiple image frames, it is required that the image content not change during this sampling window so that the calculations can be based on the same information.

In some cases the final dividing ratio, DR(new), is not exactly equal to the HTOT value suggested in the VESA standard. The cause of this mismatch is the possible frequency error of the pixel clock and/or the frequency error of HSYNC in the video cards compared to the VESA specification. By directly using HTOT as the dividing ratio without a real-time frequency-searching process, imperfect images can result.

A task of the frequency-searching algorithm is to find the number of total pixels of a video line in the active video region, HADRM. Referring back to FIG. 4, it is recognized that this task is equivalent to finding the left and right edges of the active video region. This task can be divided into three subtasks as follows:

1) Find the blank level of the RGB signals, i.e., the signal level for a black pixel.

2) Find the maximum value of the RGB signals.

3) Find the left and right edges of the active video region.

Finding the blank level of the RGB signals: For the first video line in an image frame, do the following averaging calculation:

$$\text{blank} = \sum_{N} \text{value}[\text{pixel}] / N \qquad (1)$$

where value[pixel] is the sampled, i.e., ADC converted, digital value of the red, green, or blue analog signal of a pixel, N is the number of total pixels in this first video line, and the summation is performed over all the pixels in this first video line. It is noted that the first line of any image frame is black (blank) in all VESA modes.

Finding the Maximum RGB Value: For an n-bit ADC, the output value is in the range of [0, 2n−1]. The digital RGB value associated with any pixel must fall within this range. The maximum RGB value is defined as the maximum among those values generated from all the pixels in a frame. This parameter, max_val, can be found straightforwardly by a simple search routine over the pixels in a frame.

Finding the Left and Right Edges of the Active Video Region: A threshold is computed first using:

$$\text{threshold}=\text{factor}\cdot(\text{max\_val}-\text{blank}) \qquad (2)$$

Factor is a predetermined fractional number between 0 and 1. As can be observed in FIG. 4, the RGB values of pixels in the active video region are significantly different from those in the front and back porch regions where the RGB values are at the blank (or black) level. This threshold is a value between max_val and blank and is used to identify the start and end of the active video region by testing pixel signal amplitude against the threshold. In our testing experience, 0.25 is a preferred choice for the parameter factor. Secondly, starting from the beginning of a current video line, if a series of consecutive pixels is found whose RGB values are all greater than threshold, then the first pixel of this series is the left edge of the active video region. Thirdly, starting from some point in the middle of the current video line and proceeding to the end of the same line, if a series of consecutive pixels is found whose RGB values are all smaller than threshold, then the first pixel of this series is the right edge of the active video region.

It is noted, as illustrated in FIG. 4, that for each video line there is a Back Porch at the level blank before the active video region, and a Front Porch at the level blank after the active video region. The above procedure gives the locations of the start and end of the video signal whose RGB value is significantly different from that of the level blank. A "series of consecutive pixels" whose RGB values are all greater than threshold is used since it is desired to eliminate the random error of one pixel. In our experience, five pixels are sufficient for "a series of consecutive pixels."

The left and right edges of each individual line are preferably found for all the video lines in a frame. At the end of a frame the leftmost edge (the smallest x-location of Active Start as illustrated in FIG. 4) among all the lines in this frame is the left edge of this frame, and the rightmost edge (the largest x-location of Active End) among all the lines in this frame is this right edge of the frame. The above calculations are preferably performed for all three colors (or color signals). The leftmost edge among all the colors is the final left edge. The rightmost edge among all the colors is the final right edge.

The quantity HADRM is calculated using the equation:

$$HADRM=\text{right\_edge}-\text{left\_edge} \qquad (3)$$

The distance between the left and right edges of the active video region is found by subtracting parameters such as right_edge and left_edge indicating locations of the left and right edges, and scaling the result of the subtraction as necessary such as by a multiplicative factor to find the number of pixels in the video line. Scaling may not be necessary if the parameters right_edge and left_edge measure pixel counts.

This algorithm can fail if the RGB value of the left or right edge of the entire frame for all three color signals is at the level blank or very close to the level blank, i.e., the values of the first or last few active pixels of all video lines in the frame are all smaller than threshold. For Windows™-based PC applications, most users use some kind of screen background. Scenarios that will cause this algorithm to fail when no screen background is used, and when applications are run on a totally black background.

Figure 6:
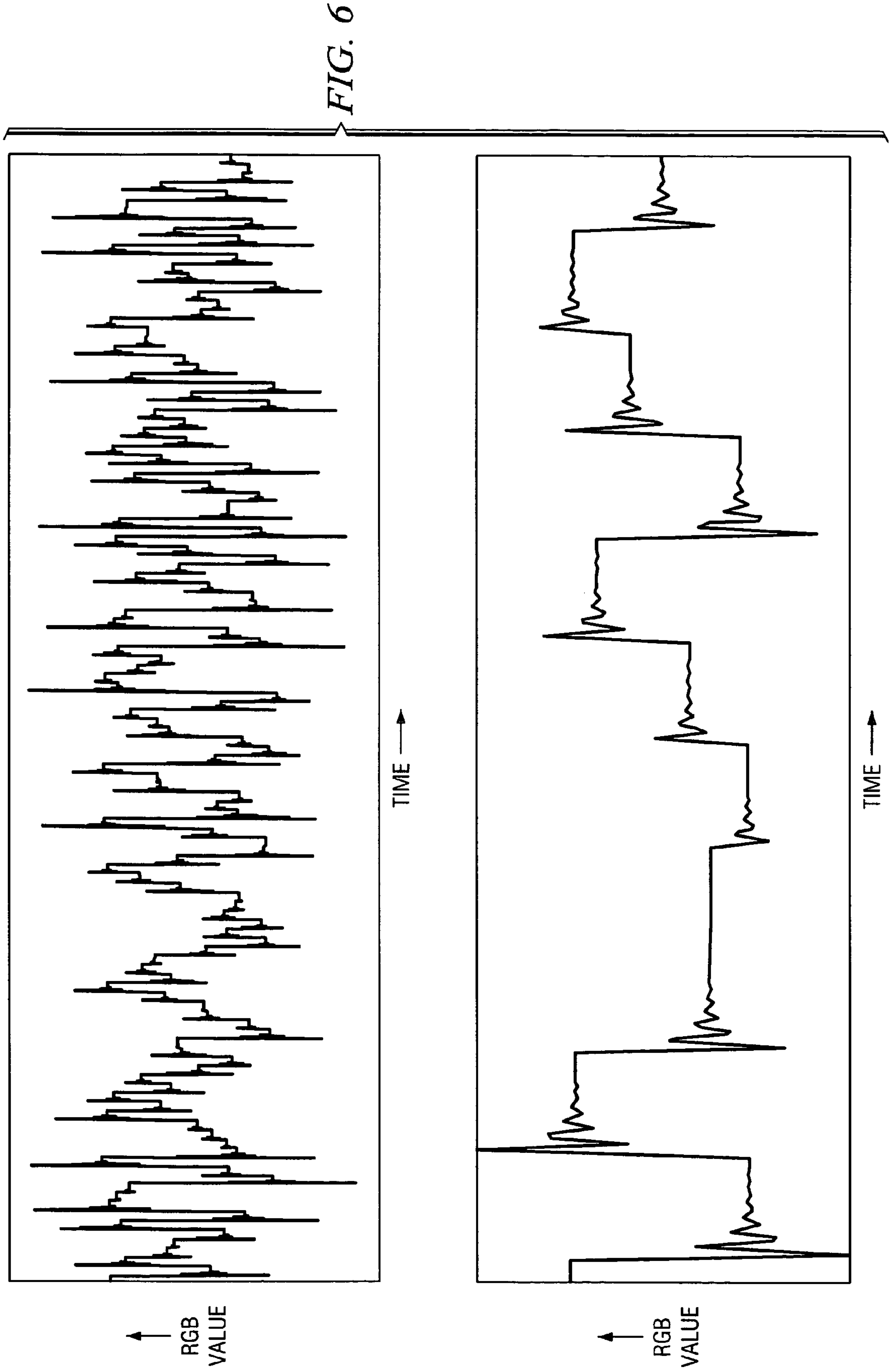
FIG. 6, illustrates a series of pixels of one video line of one particular color, and a series of pixels with an expanded time scale.

Selecting the Sampling Phase: As mentioned hereinabove, the graphics digitizers, or ADCs, are fed by the DACs that are typically located in the video/graphics card of a PC. The DACs' outputs are stepped waveforms with overshoot or undershoot at the beginning or end of the pixel boundary if adjacent pixels have different RGB levels. The top waveform in FIG. 6 illustrates a series of pixels of one video line of one particular color. The bottom waveform is a section of the top waveform on an expanded time scale. The step size along the x-axis indicates the duration of one pixel in the time domain. The y-axes in the figure represent the RGB value.

When the sampling frequency for an ADC is correctly determined, a voltage level within each pixel is sampled by the ADC and converted to a digital value. This operation is executed sequentially for each clock cycle, pixel by pixel. When to sample the analog signal within a pixel boundary has substantial impact on the converted digital value. Searching for the appropriate sampling phase to find the best "point in time" to trigger the ADC enables generating the best image.

Both the THS8083 device and the AD9884A device have 32 time steps within each clock cycle. These steps, which correspond to sampling phases, can be used to trigger the ADC at a specific time.

Studies have been done in the past on the impact of sampling clock jitter on ADC conversion. For example, a study is described by M. Shinagawa et al. in the paper entitled "Jitter Analysis of High-Speed Sampling Systems," IEEE Journal of Solid-State Circuits, Vol. 25, No. 1, February 1990, pp. 220-224, and in the paper on digital communication as described by M. G. Makhija and V. P. Telang in the paper entitled "Simulating Clock Jitter in Digital Communication Systems," IEEE, 1996, pp. 716-720. Research on reconstruction of original images from several phase-shifted images is described by S. Omori and K. Ueda in the paper entitled "High-Resolution Image Using Several Sampling-Phase Shifted Images," IEEE, 2000, Dig. Tech. Papers, pp. 178-179. The challenge in the present application is different. In a preferred embodiment the best sampling point is found so that the resulting image best resembles the original image. As can be observed in FIG. 6, good sampling points are in the intervals of time where the waveforms are flat and the signals "settle down." The overshoot/undershoot area is where the signal is still in transition and sampling should be avoided. In reality the "flat" areas are not as well developed as those shown in FIG. 6. The algorithm thus defines a quality criterion to find the best sampling choice among several candidate phases.

Reconstruction of the Analog RGB Waveform: The phase-searching algorithm is based on the RGB waveform reconstructed at the outputs of the ADCs. Oversampling the original analog signal with a higher frequency clock is one way to achieve reconstruction, but this requires a much higher frequency clock and higher speed ADCs. An alternative is to sample the same signal multiple times, each time with a different phase. Then the RGB waveform can be reconstructed from data collected at these phases. The clock phase movement should be monotonic when the phase control is swept from one end to the other end. This is true for both the THS8083 and the AD9884A devices according to their datasheets. Also, as in the case of the frequency-searching algorithm, the image content cannot change during the search process. In a preferred embodiment of the invention the procedure for reconstruction of an analog RGB waveform is described below:

1. Select one video line according to a certain criterion, preferably as described below.
2. Sample this video line multiple times, each time with a unique sampling phase.
3. Build the waveform using a two-dimensional array wf[pixel][phase] that depends on pixel and phase, where wf represents the RGB ( or equivalent) signal amplitude.

For advanced VESA modes the pixel clock frequencies are well above 100 MHz. One skilled in the art will recognize that the ADC performance will inevitably degrade with increased operating speed. To improve data quality, various filtering functions can be applied to the two-dimensional array wf[pixel][phase]. A low-pass, moving average, FIR (finite impulse response) filter is a preferred filter for this application. The following are formulas for the $I^{th}$ pixel RGB (or equivalent) filtered value using 3-, 5-, and 7-tap moving average FIR filters:

$$\text{3-tap-value}[I]=(\text{Value}[I-1]+\text{Value}[I]+\text{Value}[I+1])/3 \quad (4)$$

$$\text{5-tap-value}[I]=(\text{Value}[I-2]+\text{Value}[I-1]+\text{Value}[I]+\text{Value}[I+1]+\text{Value}[I+2])/5 \quad (5)$$

$$\text{7-tap-value}[I]=(\text{Value}[I-3]+\text{Value}[I-2]+\text{Value}[I-1]+\text{Value}[I]+\text{Value}[I+1]+\text{Value}[I+2]+\text{Value}[I+3])/7 \quad (6)$$

Parameters to Measure the Quality of the Recovered Image: Laboratory experiments show that when sampling in the "flat area" of each pixel, the recovered image has better quality than an image captured at "non-flat" sampling points. Therefore, searching for the best sampling phase is equivalent to identification of the "flattest" point in each pixel's waveform. Several functional criteria are described below to measure the "flatness" of each data point of a reconstructed waveform.

"First Derivative" Criterion:

$$fd[\text{pixel}][\text{phase}(n)]=abs(wf[\text{pixel}][\text{phase}(n+1)]-wf[\text{pixel}][\text{phase}(n)])+abs(wf[\text{pixel}][\text{phase}(n)]-wf[\text{pixel}[\text{phase}(n-1)]) \quad (7)$$

The "first-derivative" criterion used here which depends on pixel and sampling phase is not the familiar calculus definition. Instead of two data points it uses three points to calculate the "first-derivative" at the middle point. The function "abs" is the absolute value function. Absolute values are used in the calculation so that the magnitude corresponds to the "flatness" of the waveform at the current sampling point. Since the waveform of a pixel is composed of multiple (in our case 32) data points, the function fd[pixel][phase] is one way in a preferred embodiment of the invention of measuring waveform "flatness" at each data point, or sampling phase. Thus, the function fd represents change in the sampled waveform between sampling phases, preferably between consecutive sampling phases.

"Second Derivative" Criterion:

The function sd[pixel][phase] representing a "second derivative" is obtained by applying equation (7) to the function fd[pixel][phase]. This function can measure the "flatness" to second order. For both functions fd[pixel][phase] and sd[pixel][phase], the phase that makes the respective function assume its minimum value is the sampling point where the waveform is "flattest". Consequently, it is the desired sampling phase.

"Distance" Criterion:

The "distance" criterion uses the function $$\text{dist}[\text{pixel}][\text{phase}]=abs(wf[\text{pixel}][\text{phase}]-\text{ref}) \quad (8)$$

where ref[pixel] is a pixel reference value and can be without limitation one of the following:

a. average value of a pixel $$ref[\text{pixel}] = \sum_{M} wf[\text{pixel}][\text{phase}]/M \quad (9)$$

where M is the number of sampling phases available within a pixel.

b. ref[pixel][phase] is wf[pixel][phase] passed through a 3-tap filter.

c. ref[pixel][phase] is wf[pixel][phase] passed through a 5-tap filter.

d. ref[pixel][phase] is wf[pixel][phase] passed through a 7-tap filter.

In case a. above, "ref" is a variable which represents the "true" value of a pixel since it is the average RGB value of all the available points (sampling phases) within this pixel. In cases b., c., and d., "ref" is a variable that serves as the "true" value of a sampling point. "Distance" is used to measure the deviation between the sampled value and the "true" value.

The smaller the value of "dist[pixel][phase]" for a selected sampling phase, the better the image quality for the selected sampling phase. Image quality improvement with reduced distance is based on the observation that the possibility of the signal having a transition at this point is small when distance is small. Image improvement with decreased distance might not be true for every pixel, but for a group of many pixels, it is generally true. "Distance" is thus an intuitive way of quantifying the quality of the sampling phases.

Thus the functions sd and dist are also representative of change in the sampled waveform between sampling phases.

Figure 7:
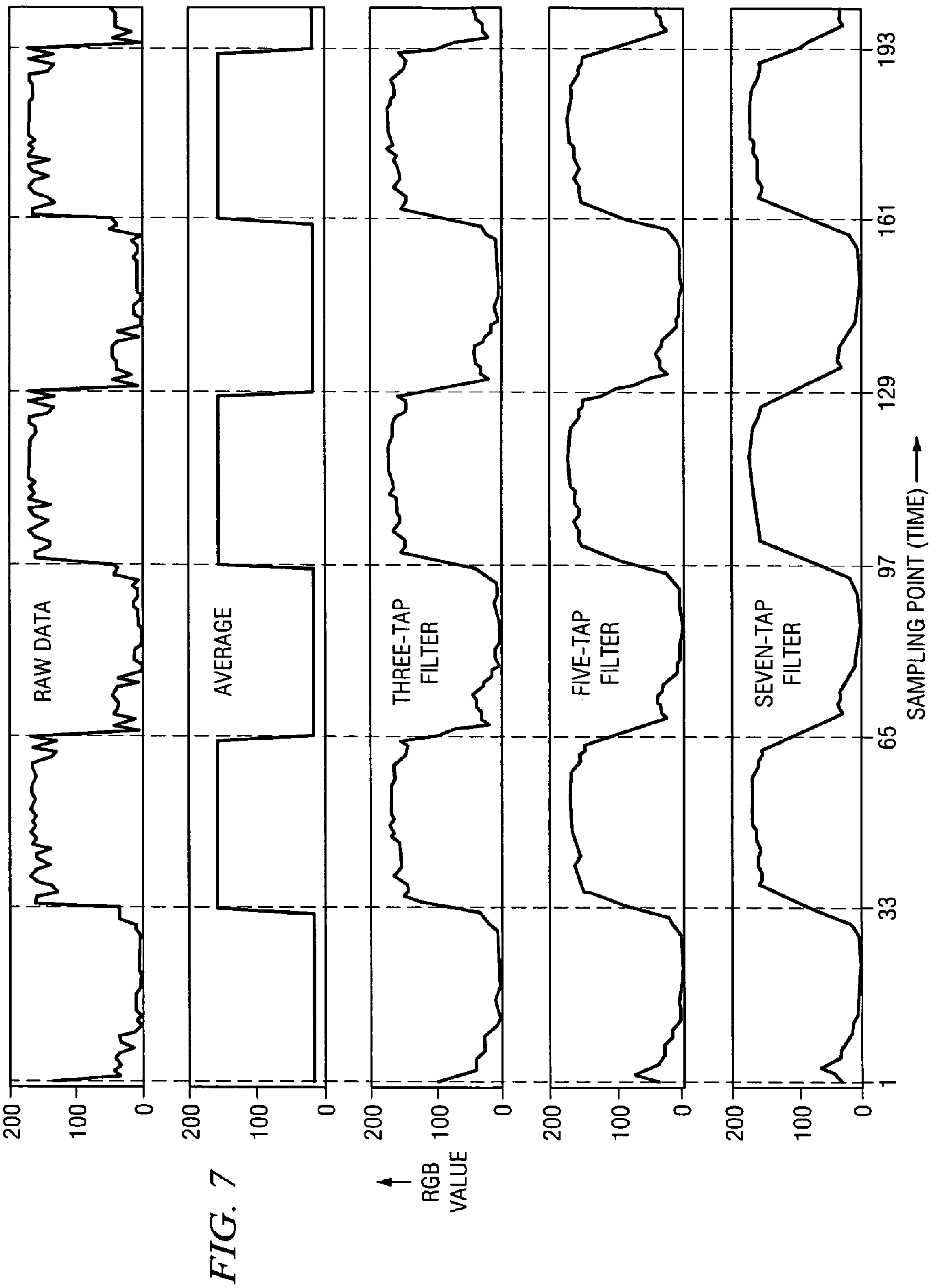
FIG. 7 illustrates raw, average, and filtered data using 3-, 5-, and 7-tap filters of a series of six pixels from an image in the VGA mode.

FIG. 7 illustrates raw, average, and filtered data of a series of six pixels from an image in the VGA mode using the 3-, 5-, and 7-tap filters above and the average value of a pixel computed from ref[pixel]. Within each pixel in the figure there are 32 data points. It can be seen that the "flat" areas are in the range of phase 19 to phase 23. In FIG. 7 the flat areas are after the middle point of each pixel.

Figure 8:
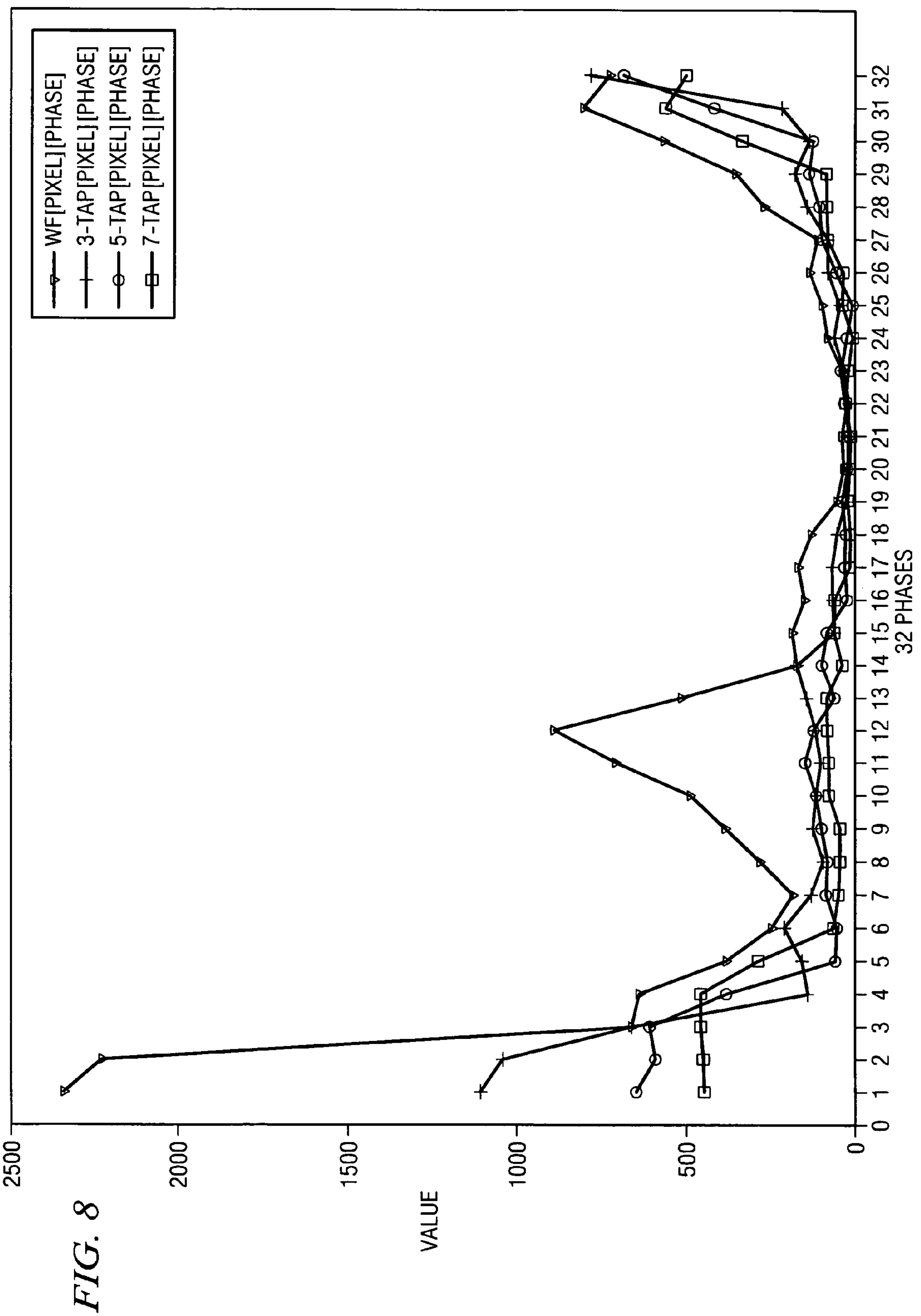
FIG. 8 illustrates four exemplary curves of the "first derivative" of the invention including exemplary curves using 3-, 5-, and 7-tap filters.

FIG. 8 shows four exemplary curves of the "first derivative" fd[phase], first using the function wf[pixel][phase] and then computing fd using 3-tap, 5-tap, and 7-tap filters. These curves were generated from a series of "high quality" pixels (50 pixels in this case). The x-axis represents the 32 sampling phases. The y-axis represents the value of fd[phase], whose absolute value is not important since our interest is where the minima are. These curves show for the present example that the minima occur around phase 21. They also suggest that the values are greater at the two ends of the sampling phases. Hence, in a preferred embodiment the ends should be avoided to sample pixel data.

Figure 9:
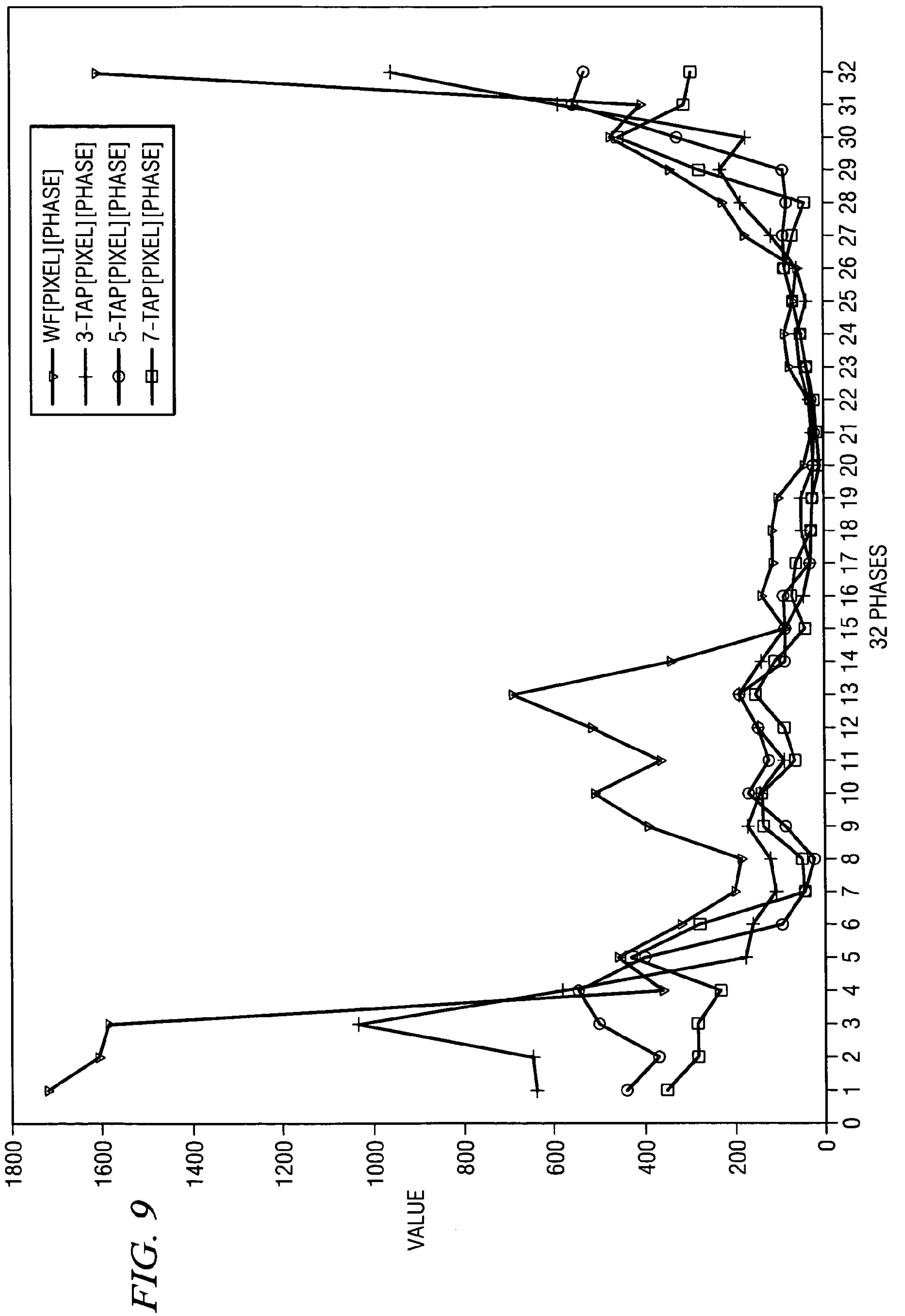
FIGS. 9 and 10 illustrate exemplary curves of "second derivative" and "distance," respectively, of the invention including exemplary curves using 3-, 5-, and 7-tap filters.
Figure 10:
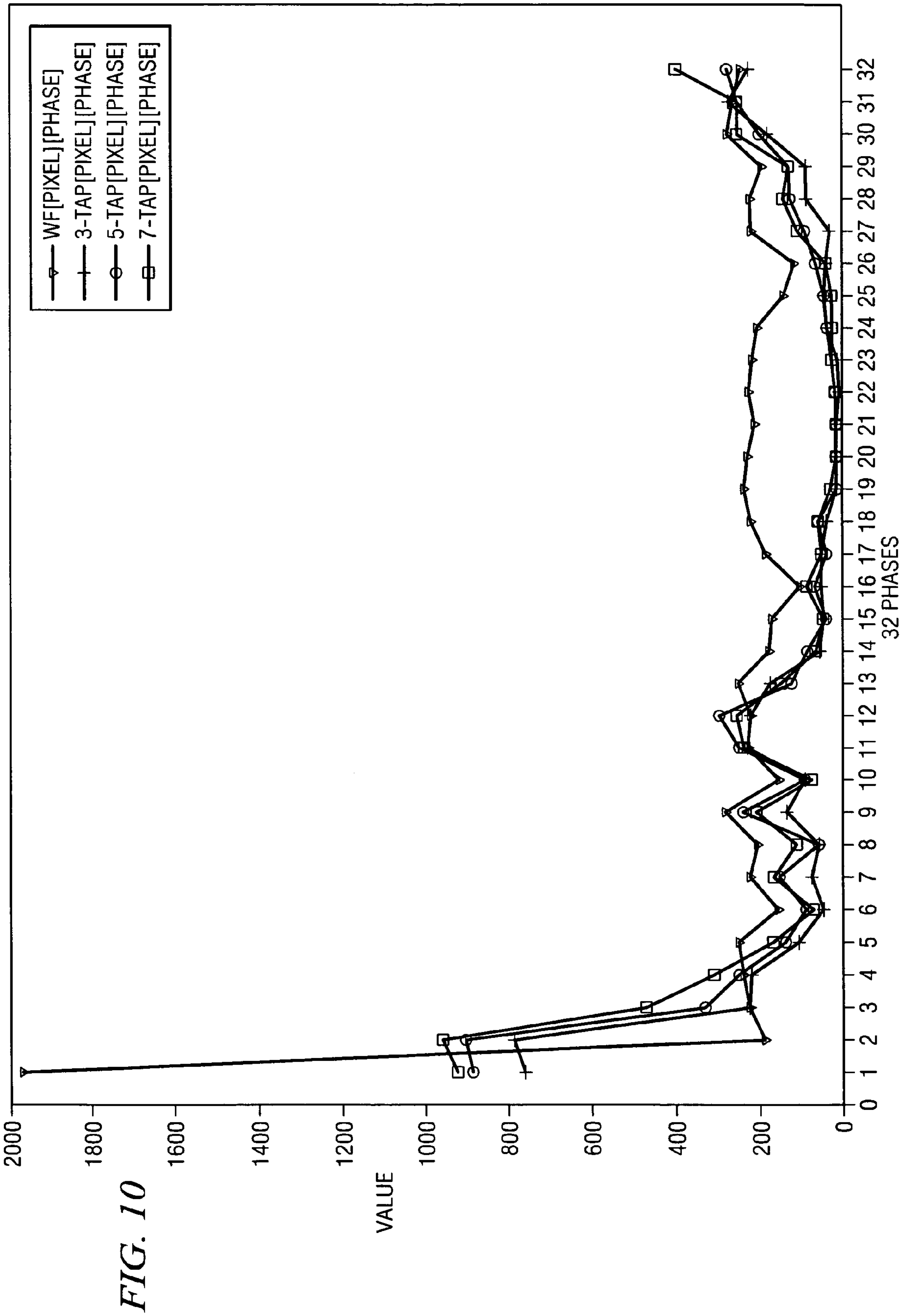

FIGS. 9 and 10 illustrate corresponding curves of sd[phase] and dist[phase]. The curves in FIGS. 8 and 9 show that the parameters assume their minima in the region from phase 19 to phase 23. In FIG. 10 of the curves for distance, the curve of wf[pixel][phase] which is based on equation (9) of case a shows a different effect. The reason is that the average value of pixels is not a good indicator when calculating distance since the high frequency information is lost.

Most Active Line and High Quality Pixels:

The functions "first-derivative", "second-derivative" and "distance" as defined above with a pixel index depend on "one pixel." To reduce random error, a plurality of pixels is preferred. Ideally, all pixels in a frame should be used to build the arrays wf[pixel][phase], fd[pixel][phase], sd[pixel][phase], or dist[pixel][phase]. But using all pixels in a frame requires a large amount of memory. One way of reducing the memory requirement is to use just one line of pixels (or a small number of lines), such as the "most-active" video line as described below. In an alternative embodiment of the invention, a series of "high-quality" pixels is found so that memory usage can be further reduced.

In an image frame, there are usually areas of "high-activity" and areas of "low-activity". In "high-activity" areas, colors vary dramatically, and the RGB values of the pixels in these areas are significantly different from each other. These "high-activity" areas are sensitive to selection of the sampling phase. Consequently, these pixels contain more phase information than others. A line with these special pixels is denoted as a "most-active" video line. They will be used to build the array wf[pixel][phase] and the like.

Searching for the Most Active Video Line:

Several parameters can be used as references when comparing characteristics of different video lines. The total RGB "energy" of a video line, or $E_{rgb}$, can be defined as:

$$E_{rgb} = \sum_N (rv + gv + bv) \tag{10}$$

where N is the number of total pixels in the video line, and rv, gv and bv are the red, green, and blue sampled RGB values.

Red (or Green or Blue) switch energy of a video line, or $SE_r$, is defined as:

$$SE_r = \sum_N \text{abs}(rvc - rvp) \tag{11}$$

The quantities rvc & rvp represent the red RGB values of the current pixel and the previous pixel, respectively. The quantities $SE_g$ and $SE_b$ are similarly defined. The total RGB switch energy of a video line is given by:

$$SE_{rgb} = SE_r + SE_g + SE_b \tag{12}$$

The "most-active" video line is identified as the line with maximum $SE_{rgb}$. The other parameters ($E_{rgb}$, $SE_r$, $SE_g$, $SE_b$) can be used to quantify the confidence level of the "most-active" line.

Searching for "High-Quality" Pixels:

These pixels can be identified by using the criterion:

a. the pixels must be spatially consecutive;
b. the red (or green or blue) values of adjacent pixels must be different;
c. the values-difference of adjacent pixels must be greater than a predetermined low threshold; and
d. the values-difference of adjacent pixels must be smaller than a predetermined high threshold.

A low threshold is needed because a portion of the waveform with significant overshoot and undershoot is desired. Phase information is expressed better in these types of waveforms. A high threshold is required for signal integrity. If the values of adjacent pixels change too rapidly, the ADC may not be able to respond properly, and the resulting waveform will not be of high integrity. The preferred values are 80% of the full range of the ADC for the high threshold and 30% for the low threshold. The search for this series of "high-quality" pixels can be performed continuously for a frame of data. At the end of the frame, the longest series that satisfies the above criterion is the selected series in a preferred embodiment of the invention.

Figure 11:
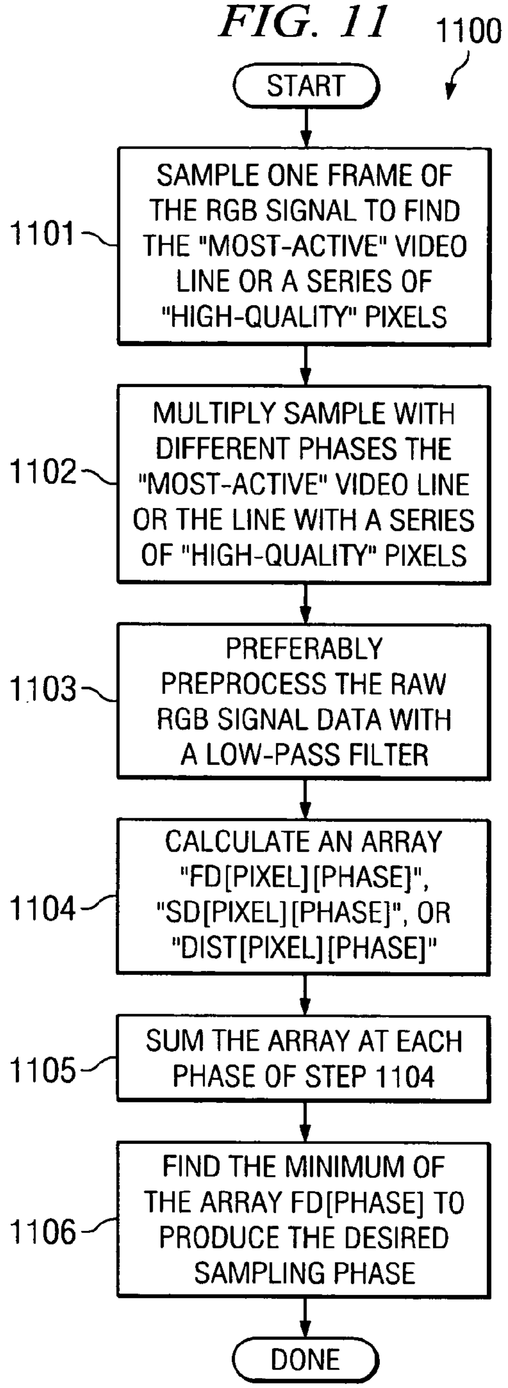
FIG. 11 illustrates a flowchart of the phase-searching algorithm of the invention.

Turning now to the phase-searching algorithm for sampling phase control in a preferred embodiment of the invention, it can be described as follows and as illustrated diagrammatically in the figure. The steps below for the sampling phase control algorithm 1100 are keyed to the reference designations in FIG. 11.

1101: Find the sampling frequency by the method described hereinabove. Sample one frame of the RGB signal to find the "most-active" video line or a series of "high-quality" pixels.

1102: Sample multiple times the "most-active" video line or the line that contains the series of "high-quality" pixels, sampling each time with a different phase for all the possible phases. Build the array wf[pixel][phase].

1103: Preferably preprocess the raw RGB signal data by operating on the array wf[pixel][phase] with a low pass filter (preferably with a 3-tap, 5-tap, or 7-tap moving average filter).

1104: Calculate an array "fd[pixel][phase]", "sd[pixel][phase]", or "dist[pixel][phase]".

1105: Sum the array of step 4 at each phase as shown in equation (13) below, where N represents all the pixels in the "most-active" video line or in the series of "high-quality" pixels:

$$fd[\text{phase}] = \sum_N fd[\text{pixel}][\text{phase}] \tag{13}$$

1106: Find the minimum of the array fd[phase]. The phase that produces the minimum is the desired sampling phase.

In equation (13), the array "fd[pixel][phase]" can be replaced by an array formed with "sd[pixel][phase]" or by an array formed with "dist[pixel][phase]". The function fd is, thus, evaluated over a two-dimensional array of pixels and sampling phases.

In this algorithm, the raw data is preprocessed preferably by the moving average filters described by equations (4) (5) and (6). Moving average filters are averaging filters whose main advantage is simplicity. Moving average filters can be implemented inexpensively in hardware or software. But high frequency components in the signals are not well-preserved. Median filters, which are better for preserving edges, can potentially do a better job of preserving phase information. However, this type of filter is more expensive due to numerical sorting in its mechanism. Savitsky-Golay filters can also be used to replace the filters described by equations (4) (5) and (6). This type of filter tends to preserve high frequency components which are needed in judging phase better than moving average filters. But they are also more expensive to implement.

This phase-searching algorithm can fail to produce an optimal phase if the series of "high-quality" pixels or the "most-active" video line cannot be found in a frame, i.e., the entire image frame does not contain significant or sufficient color change, or there is no useful information to view. A totally black or blue screen is an example failing the phase-searching algorithm. A solution is to switch to another, more useful image.

Implementation Guidelines:

These algorithms can be implemented in any application that has a microcontroller or microprocessor in the system. The goal of this section is to provide guidelines to help designers implement the algorithms in their system. It is contemplated and within the scope of the appended claims that the invention may be used in systems which do not necessarily follow these guidelines.

A. Partitioning Between Hardware and Software:

Since the algorithms require both real-time data collection and a significant amount of numerical calculations, well-defined partitioning between hardware and software can ensure attractive system performance with low cost. Partitioning can be discussed in the following two scenarios:

If a Frame Buffer Is Available:

If the algorithms are implemented in a system that has a frame buffer, then the tasks of finding blank levels, maximum values, and active video edges can all be accomplished using data stored in the frame buffer. The "high-quality" pixels or "most-active" video line can also be found using these data. The task of collecting data for phase-searching requires multiply sampling a video line, which can also be done utilizing the frame buffer. Therefore, the algorithms can be implemented in software plus the frame buffer. No additional hardware is needed except for a microcontroller that can be shared with other functions.

If a Frame Buffer Is Not Available:

By examining the procedures described hereinabove, the tasks can be partitioned into three hardware blocks.

BLK1: find the blank levels and the maximum RGB values of an image frame.

BLK2: find the left and right edges of the active video region, and search for "high-quality" pixels.

BLK3: collect data for the sampling phase calculation.

The task of finding blank levels and maximum RGB values preferably requires real-time RGB data. This can preferably be accomplished in hardware. Both blank levels and maximum values are available at the end of the first frame. Finding the left and right edges of the active video region also needs real-time RGB data. Since this task uses the blank levels and the maximum values obtained in BLK1, it can only be executed for the second frame in BLK2. The task of searching for "high-pixels" should also be assigned to BLK2 since these pixels will be needed later in BLK3. When the correct sampling frequency has been identified and "high-quality" pixels become available, BLK3 can be invoked to collect data for the sampling phase calculation.

For the algorithms described above to function correctly, certain variables have to be passed from software to hardware, and vice verse. A memory unit is required for storing these variables. This memory is also useful for storing data collected by BLK3. Therefore, two additional hardware blocks are needed: BLK4 for a memory controller and BLK5 for memory of a certain size.

B. Software Development Guidelines:

In real application, the algorithms can be implemented as an "auto-sync" function in digital display devices. When a user pushes an "auto-sync" button, an interrupt request is presented to the microcontroller. If granted, the interrupt handler dedicated for the "auto-sync" function is invoked. The sequence of actions that should be coded in this function is shown below:

1. Set the initial sampling frequency to the value defined in the VESA specification.
2. Find the blank levels and the maximum RGB values, and store them in memory. (hardware BLK1).
3. Calculate threshold, find active video edges, find "high-quality" pixels, and store the results in memory. (hardware BLK2)
4. Compute HADRM. (preferably using microcontroller software)
5. Is HADRM=HADR true? If not, recalculate the dividing ration, DR(new), reset the frequency register, and go back to step 2. If true, then the correct sampling frequency has been found, and go to the next step. (using microcontroller software)
6. Set the phase register, and collect data for this phase. Repeat this step for all available phases. (hardware BLK3)
7. Do the calculation to find the desired phase. (software in the microcontroller)

C. Estimation of Execution Time:

The allowable execution times for BLK1 and BLK2 are each one frame of time. BLK3 requires 32 frames if there are 32 phases. The time required for software activity is dependent on the speed of the microcontroller and the function chosen for measuring image quality.

An apparatus and method of automatically searching for the sampling frequency and the sampling phase for a graphic digitizer has been described. The frequency- and phase-searching algorithms have been intensively tested with positive results. In a preferred embodiment of the invention, the frequency-searching algorithm can efficiently adjust the PLL divider ratio and accurately recover the encoded image. For the sampling phase search, several functions have been introduced to measure the quality of the recovered image. To quantify the quality of an image, any of the three functions ("first-derivative", "second-derivative" and "distance") can be used. Compared to the "first-derivative" function, the "second-derivative" function can calculate signal "flatness" to second order, but, it is also the more computationally intensive parameter. In terms of memory usage and the CPU computational burden, the function "distance" is the most efficient. The algorithms can be applied in applications that require choosing the sampling frequency and sampling phase for an ADC converter. Especially in applications of digital display devices (a display using a fixed pixel structure such as an LCD, PDP, FED, DMD, etc. where LCD is Liquid Crystal Display, PDP is Plasma Display Panel, FED is Field Emission Display, and DMD is Digital Micromirror Device] driven by an analog video/graphics source, these algorithms can be implemented as an "auto-sync" function.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing reduced timing jitter as described herein may be varied while remaining within the broad scope of the present invention. It will be further understood by those skilled in the art that other video signal representations such as YUV and gray-scale representations can be substituted for RGB video signal representations in processes described hereinabove with accommodations as necessary within the broad scope of the invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital display device constructed to receive an analog signal representing an image formed of pixels in video lines, the video lines including an active video region, and to receive a signal containing a synchronization waveform for the image, comprising:

an analog-to-digital converter to receive the analog signal and convert it into a sampled digital waveform for displaying the image;

a phase-locked loop including a programmable frequency divider, wherein the programmable frequency divider is controlled by a dividing ratio, and wherein the phase-locked loop is coupled to the signal containing the synchronization waveform and is coupled to the analog-to-digital converter to control its sampling time; and a dividing-ratio circuit coupled to the programmable frequency divider to control the dividing ratio for the programmable frequency divider;

wherein the dividing ratio is computed by:

selecting a dividing ratio;

measuring the number of pixels in a video line using the dividing ratio to control the programmable frequency divider; and recomputing the dividing ratio by multiplying the dividing ratio by the expected number of pixels in a video line and dividing by the measured the number of pixels in a video line.

2. The digital display device according to claim 1, wherein the analog signal representing the image with video lines has left and right edges of the active video region, and wherein the number of pixels in the video line is measured by:

finding the blank level of the video signal;

finding the maximum value of the video signal;

identifying the left and right edges of the active video region using a threshold between the blank level and the maximum value to test pixel signal amplitude; and determining the number of pixels in the video line by subtracting the right edge from the left edge.

3. The digital display device according to claim 2, wherein identifying the left and right edges of the active video region further includes testing pixel signal amplitudes of a series of consecutive pixels against a threshold lying between a maximum pixel amplitude and a blank level.

4. The digital display device according to claim 1, wherein the signal containing the synchronization waveform is superimposed onto the analog signal representing the image.

5. The digital display device according to claim 1, wherein the analog signal is a red video signal.

6. The digital display device according to claim 1, wherein the analog-to-digital converter has a selectable sampling phase and wherein a sampling phase control circuit coupled to the analog-to-digital converter selects the sampling phase.

7. The digital display device according to claim 6, wherein the sampling phase control circuit selects the sampling phase by:

selecting a video line;

sampling the video line with a plurality of sampling phases; and selecting the sampling phase by minimizing a function evaluated over a two-dimensional array of pixels and sampling phases, the function representative of the flatness of the sampled digital waveform.

8. The digital display device according to claim 7, wherein the function is representative of change in the sampled waveform between sampling phases.

9. The digital display device according to claim 7, wherein the sampled digital waveform is filtered with a moving average filter.

10. The digital display device according to claim 7, wherein a video line with high energy is selected.

11. A digital display device constructed to receive an analog signal representing an image formed of pixels in video lines, the video lines including an active video region, and to receive a signal containing a synchronization waveform for the image, comprising:

an analog-to-digital converter to receive the analog signal and convert it into a sampled digital waveform for displaying the image, wherein the analog-to-digital converter has a selectable sampling phase; and a sampling phase control circuit coupled to the analog-to-digital converter that selects the sampling phase by:

selecting a video line;

sampling the video line with a plurality of sampling phases; and selecting the sampling phase by minimizing a function evaluated over a two-dimensional array of pixels and sampling phases, wherein the function is representative of the flatness of the sampled digital waveform.

12. The digital display device according to claim 11, wherein the function is representative of change in the sampled waveform between sampling phases.

13. The digital display device according to claim 11, wherein the sampled digital waveform is filtered with a moving average filter.

14. The digital display device according to claim 11, wherein a video line with high energy is selected.

15. The digital display device according to claim 11, wherein a video line with high quality is selected.

16. A method of constructing a digital display device to display an image, the image formed of pixels in video lines, the video lines including an active video region, comprising the steps of:

receiving an analog signal representing the image and a signal containing a synchronization waveform for the image;

converting the analog signal into a sampled digital waveform with an analog-to-digital converter in the digital display device to display the image, wherein the analog-to-digital converter has a controllable sampling time;

controlling the sampling time of the analog-to-digital converter with a phase-locked loop coupled to the analog-to-digital converter and coupled to the signal containing the synchronization waveform, wherein the phase-locked loop includes a programmable frequency divider controlled by a dividing ratio; and determining the dividing ratio by the further steps of:

selecting a dividing ratio:

measuring the number of pixels in a video line using the dividing ratio to control the programmable frequency divider; and recomputing the dividing ratio by multiplying the dividing ratio by the expected number of pixels in a video line and dividing by the measured number of pixels in a video line.

17. The method according to claim 16, wherein the analog-to-digital converter has a selectable sampling phase, the method further comprising the steps of:

coupling a sampling phase control circuit to the analog-to-digital converter to select the sampling phase by:

selecting a video line;

sampling the video line with a plurality of sampling phases; and selecting the sampling phase by minimizing a function evaluated over a two-dimensional array of pixels and sampling phases representative of the flatness of the sampled waveform.

18. The method according to claim 17, further including selecting the function to represent change in the sampled waveform between sampling phases.

19. The method according to claim 17, further including filtering the sampled waveform with a moving average filter.

20. The method according to claim 17, further including selecting a video line with high energy.

* * * * *